United States Patent
Fang et al.

(10) Patent No.: US 7,646,624 B2
(45) Date of Patent: Jan. 12, 2010

(54) METHOD OF SELECTING OPERATING CHARACTERISTICS OF A RESISTIVE MEMORY DEVICE

(75) Inventors: Tzu-Ning Fang, Palo Alto, CA (US); Swaroop Kaza, Santa Clara, CA (US); An Chen, Sunnyvale, CA (US); Sameer Haddad, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 18 days.

(21) Appl. No.: 11/590,378

(22) Filed: Oct. 31, 2006

(65) Prior Publication Data
US 2008/0112206 A1  May 15, 2008

(51) Int. Cl.
*G11C 11/00* (2006.01)
(52) U.S. Cl. .............................. 365/148; 265/163
(58) Field of Classification Search ............. 365/148, 365/163
See application file for complete search history.

(56) References Cited

U.S. PATENT DOCUMENTS

| | | | |
|---|---|---|---|
| 4,420,766 A * | 12/1983 | Kasten | 365/103 |
| 6,657,888 B1 * | 12/2003 | Doudin et al. | 365/158 |
| 6,806,526 B2 * | 10/2004 | Krieger et al. | 257/296 |
| 6,809,976 B2 * | 10/2004 | Ooishi | 365/158 |
| 7,057,922 B2 * | 6/2006 | Fukumoto | 365/158 |
| 7,308,067 B2 * | 12/2007 | Lowrey et al. | 365/185.24 |
| 7,319,235 B2 * | 1/2008 | Happ | 257/2 |
| 2003/0155602 A1 | 8/2003 | Krieger et al. | 257/306 |
| 2005/0030787 A1 | 2/2005 | Lowrey et al. | 365/163 |
| 2005/0174835 A1 | 8/2005 | Rinerson et al. | 365/171 |
| 2006/0175598 A1 | 8/2006 | Krieger et al. | 257/4 |
| 2008/0050872 A1 * | 2/2008 | Hsu et al. | 438/238 |

FOREIGN PATENT DOCUMENTS

| WO | WO2005/117021 | 12/2005 |
|---|---|---|
| WO | WO2006/124235 | 11/2006 |

OTHER PUBLICATIONS

Reproducibleswitching effect in thin oxide films for memory applications, A. Beck, J. G. Bednorz, Ch. Gerber, C. Rossel, D. Widmer, Applied Physics Letters, vol. 77, No. 1, Jul. 3, 2000, pp. 139-141.
The role of space-charge-limited-currentconduction in evaluation of the electrical properties of thin Cu2O films, A. E. Rakhshani, J. Appl. Phys. 69(4), Feb. 15, 1991, pp. 2365-2368.
Hysteretic current-voltagecharacteristics and resistance switching at an epitaxial oxide Schottky junction SrRuO3/SrTi0.99Nb0.01)3,T. Fuji, M. Kawasaki, A. Sawa, H. Akoh, Y Kawazoe, Y. Tokura, Applied Physics Letters 86, 012107(2005),Dec. 23, 2004, pp. 1-3.

(Continued)

*Primary Examiner*—Huan Hoang

(57) ABSTRACT

In a method of providing an operating characteristic of a resistive memory device, material of an electrode thereof is selected to in turn provide a selected operating characteristic of the device. The material of the electrode may be reacted with material of an insulating layer of the resistive memory device to form a reaction layer, the selected operating characteristic being dependent on the presence of the reaction layer.

20 Claims, 10 Drawing Sheets

OTHER PUBLICATIONS

Current-driven insulator-conductortransition and nonvolatile memory in chromium-dopedSrTiO3 single crystals, Y. Watanabe, J. G. Berdnoz, A. Bietsch, Ch. Gerber, D. Widmer, A. Beck, S. J. Wind, Applied Physics Letter, vol. 78, No. 23, $ Jun. 2001, pp. 3738-3740.

Non-Volatile Resistive Switching for Advanced Memory Applications, An Chen, Sameer Haddad, Yi-Ching (Jean) Wu, Tzu-Ning Fang, Zhida Lan, Steven Avanzino, Suzette Pangrle, Matthew Buynoski, Manuj Rathor, Wei Daisy Cai, Nick Tripsas, Colin Bill, Michael VanBuskirk, Masao Taguchi, 2005 IEEE (4 pages).

* cited by examiner

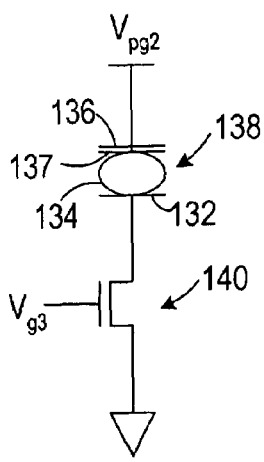 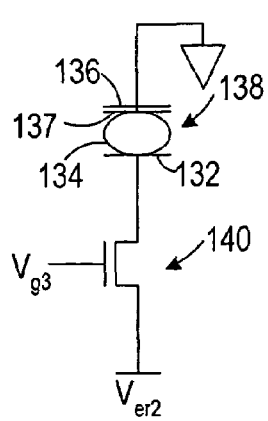 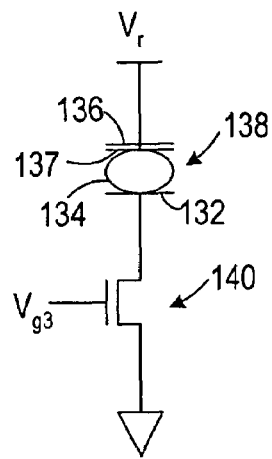
FIGURE 13    FIGURE 14    FIGURE 15
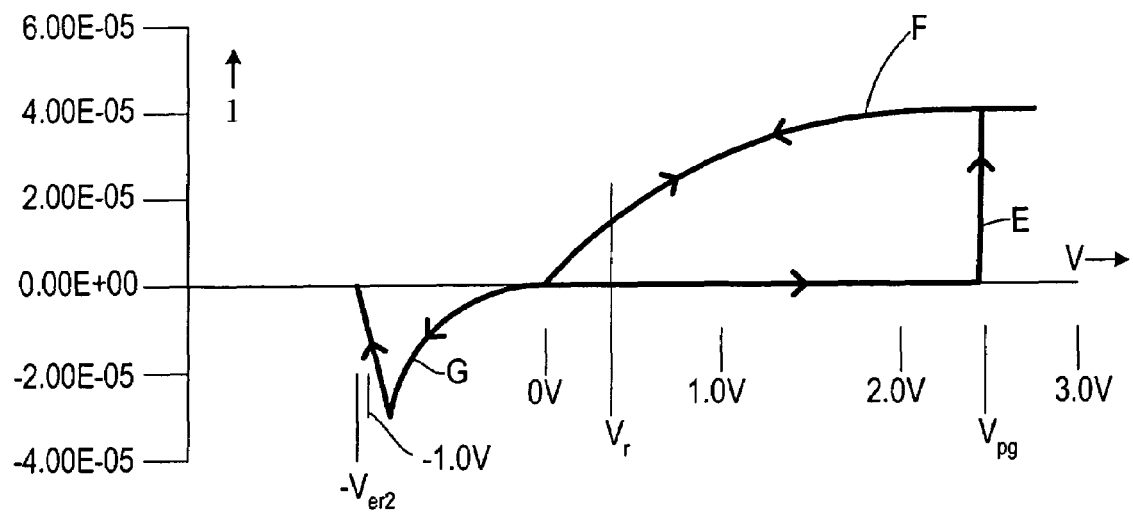
FIGURE 16

METHOD OF SELECTING OPERATING CHARACTERISTICS OF A RESISTIVE MEMORY DEVICE

BACKGROUND OF THE INVENTION

1. Technical Field

This invention relates generally to memory devices, and more particularly, to selection of operating characteristics of resistive memory devices.

2. Background Art

Recently, resistive memory devices have been developed for use in storage applications in electronic devices. A typical resistive memory device is capable of selectively being placed in a low resistance ("programmed") state and a high resistance ("erased") state. The state of the device is read by providing an electrical potential across the device and sensing the level of current through the device. These devices are appropriate for use in a wide variety of electronic devices, such as computers, personal digital assistants, portable media players, digital cameras, cell phones, automobile engine controls and the like. In these various uses, resistive memory devices are subjected to a wide variety of conditions. It would be desirable to tailor operating characteristics of the devices to the particular usage thereof.

Therefore, what is needed is an approach wherein particular operating characteristics of resistive memory devices may be selected.

DISCLOSURE OF THE INVENTION

Broadly stated, a method of providing an operating characteristic of a resistive memory device comprises selecting material of an electrode of the resistive memory device, the selected operating characteristic being dependent on the selected material of the electrode. The material of the electrode may be reacted with material of an insulating layer of the resistive memory device to form a reaction layer, the selected operating characteristic being dependent on the presence of the reaction layer.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

FIGS. 13-16 illustrate steps in programming, erasing and reading the state of the resistive memory device formed by the method of FIGS. 8-11;

BEST MODE(S) FOR CARRYING OUT THE INVENTION

Reference is now made in detail to specific embodiments of the present invention which illustrate the best mode presently contemplated by the inventors for practicing the invention.

Figure 1:
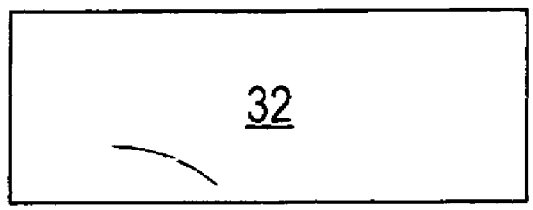
FIGS. 1-3 illustrate fabrication of a first embodiment of resistive memory device.
Figure 2:
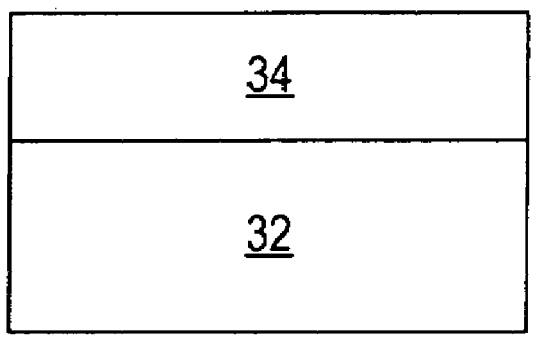
Figure 3:
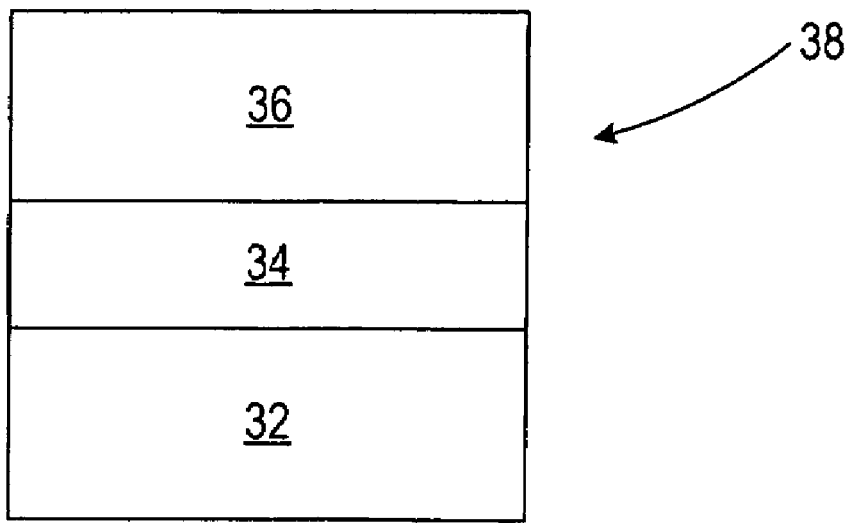

FIG. 1-3 illustrate the fabrication of a first embodiment of resistive memory device. Initially, a copper electrode 32 is provided (FIG. 1). A $Cu_2O$ layer 34 is thermally grown by oxidizing copper of the electrode 32, providing a $Cu_2O$ insulating layer 34 on and in contact with the electrode 32 (FIG. 2). A second electrode 36, of Ni or Co, is deposited on and in contact with the insulating layer. The electrode 32, insulating layer, and electrode 36 form a first embodiment of resistive memory device 38. The electrode 32 is connected to the drain of an access MOS transistor 40, which has its source connected to ground (shown in schematic form in FIGS. 4-7).

The switching mechanism of the resistive memory device 38 is explained based on the Space-Charge-Limited-Conduction model. In a solid material with unfilled deep traps, SCLC current is significantly lowered from the trap-free case by a ratio θ, determined by the trap depth ($\Delta E_t$) and density ($N_t$) as $\theta \propto \exp(\Delta E_t/kT)/N_t$. A dramatic resistance reduction occurs when the deep traps are filled at the traps-filled-limit voltage ($V_{TFL}$) that is determined by the unfilled deep trap density. After that the material is switched from a high-resistance state ("OFF") into a low-resistance state ("ON"). The ON state retention is determined by the "thermal release time" (detrapping through thermal processes) that is exponentially proportional to $\Delta Et$ as $\tau \propto \exp(\Delta E_t/kT)$.

Figure 8:
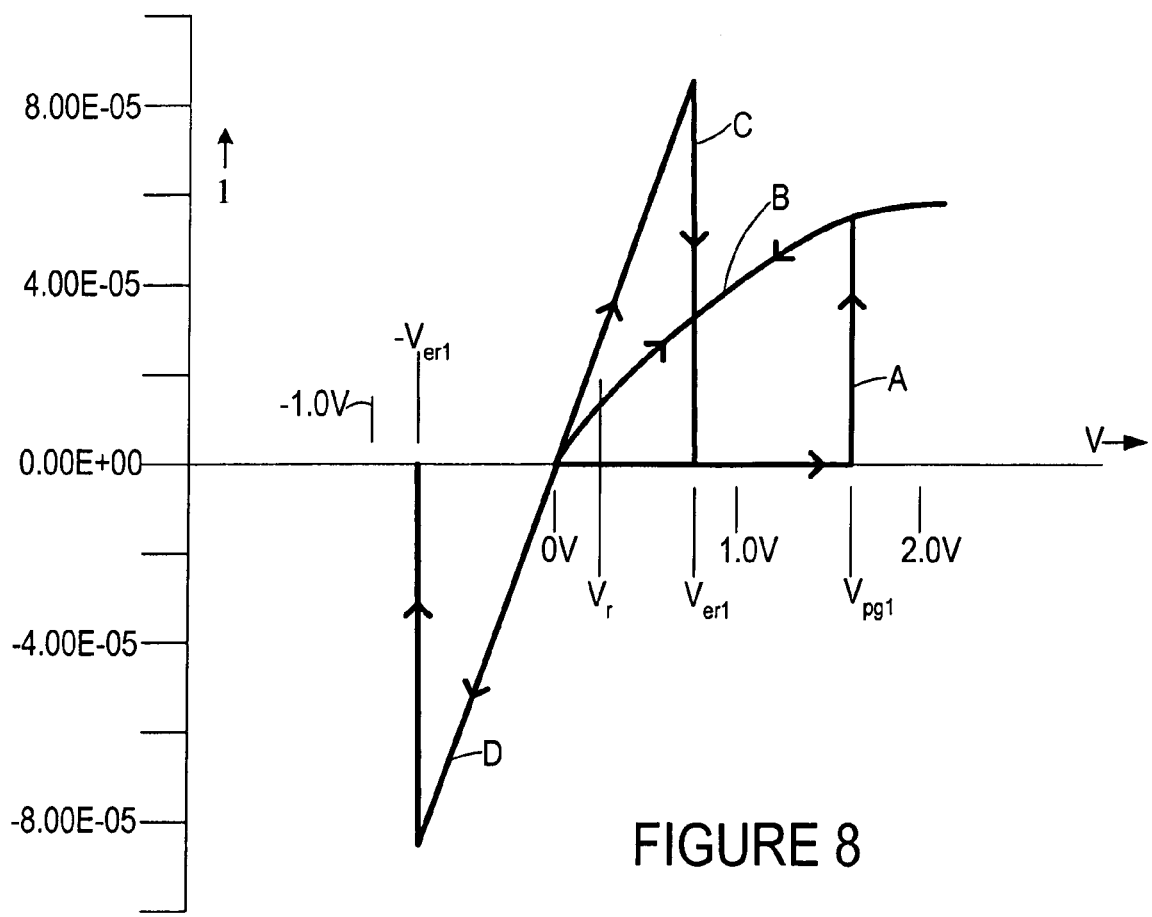

FIG. 8 is a plot of resistive memory device current vs. electrical potential applied across the memory device 38 with a Ni electrode 36. In order to program the memory device 38 (FIGS. 4 and 8), an electrical potential is applied across the resistive memory device 38 from a higher to a lower electrical potential in the direction of from electrode 36 to electrode 32, by applying an electrical potential $V_{pg1}$ (the "program" electrical potential) to the electrode 36. This causes electronic charge carriers in the form of electrons and/or holes to enter the insulating layer 34 and fill traps in layer 34, so that the overall memory device 38 is switched to a conductive, low-resistance (programmed) state (A). The current through the resistive memory device 38 is limited to a relatively low level by application of a relatively low voltage $V_{g1}$ to the gate of the transistor 40. Upon removal of such potential the memory device 38 remains in a conductive or low-resistance state having an on-state resistance indicated at (B), due to the long retention associated with deep trap levels.

In order to erase the resistive memory device 38 (FIGS. 5 and 8), an electrical potential is applied across the memory device 38 from a higher to a lower electrical potential in the direction of from electrode 36 to electrode 32, i.e., the same direction as the programming potential, by applying $V_{er1}$ (the "erase" electrical potential) to the electrode 36. The erase potential is substantially lower than the programming potential so as to avoid the possibility of undesirably reprogramming the device 38 in the erase step. Meanwhile, the voltage $V_{g2}$ applied to the gate of the transistor 40 is higher than in the programming step to provide higher current flow though the device 38. The high current causes a temperature rise in the device via Joule heating. This causes electronic charge carriers to escape, i.e., leave the traps in the insulating layer 34 (C), so that the overall memory device 38 is in a high-resistance (erased) state.

Figures 4, 5, 6, 7:
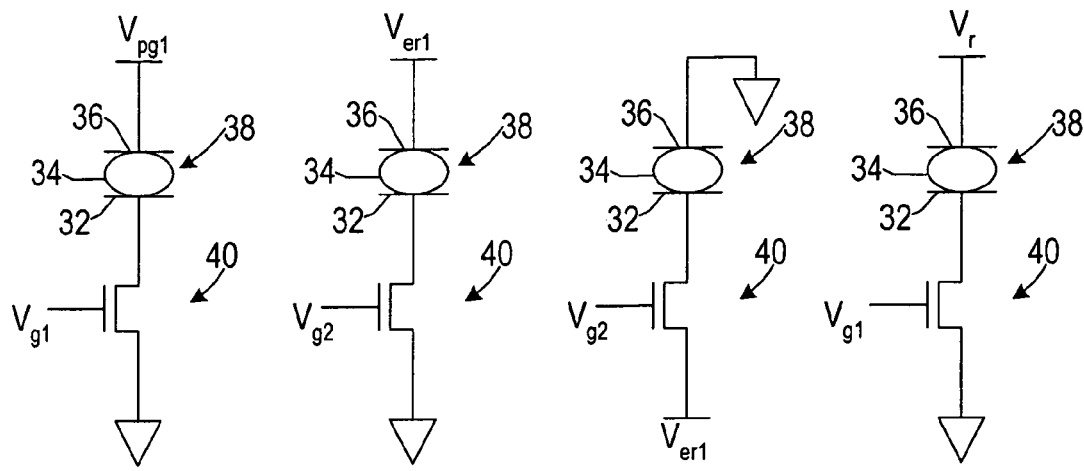
FIGS. 4-8 illustrate steps in programming, erasing and reading the state of the resistive memory device formed by the method of FIGS. 1-3.

The memory device 38 may be erased using a second approach (FIGS. 6 and 8). In this approach, the erase electrical potential is applied across the memory device 38 from higher to lower potential in the direction from the electrode 32 to the electrode 36, i.e., in the direction opposite that as applied in the programming of the device 38, by applying $V_{er1}$ to the electrode 32 and grounding electrode 36. This causes electronic charge carriers to escape the traps in the insulating layer 34 (D), so that the overall memory device 38 is in a high-resistance (erased) state.

In the read step of the memory device 38 in its programmed (low resistance) state or its erased (high resistance) state (FIGS. 7 and 8), an electrical potential $V_r$ (the "read" electrical potential) is applied across the memory device 38 from a higher to a lower electrical potential in the direction from the electrode 36 to the electrode 32, or vice versa, by applying $V_r$ (the "read" electrical potential) to the electrode 36. This electrical potential is less than the electrical potentials applied across the memory device 38 for programming and erasing. In this situation, with the voltage $V_{g1}$ applied to the gate of the transistor 40 as in the programming step, the memory device 38 will readily conduct current in its programmed state, and will allow only minimal current therethrough in its erased state, indicating the memory device 38 to be in its programmed state or its erased state.

Figure 9:
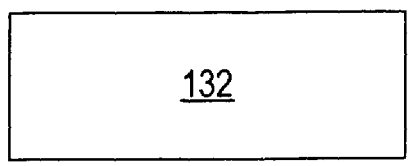
FIGS. 9-12 illustrate fabrication of a second embodiment of resistive memory device.
Figure 10:
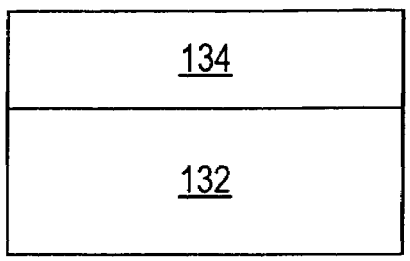
Figure 11:
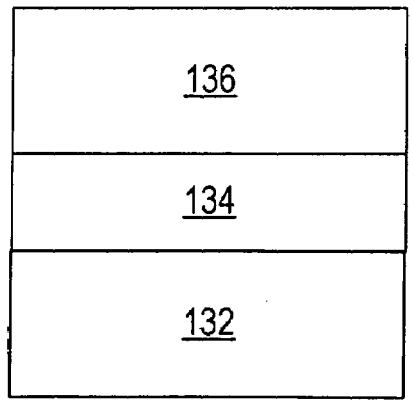

FIG. 9-12 illustrate the fabrication of a second embodiment of resistive memory device. Initially, a copper electrode 132 is provided (FIG. 9). A $Cu_2O$ layer 134 is thermally grown by oxidizing copper of the electrode 132, to provide a $Cu_2O$ insulating layer 134 on and in contact with the electrode 132 (FIG. 10). A second electrode 136, of Ti or Ta, is deposited on and in contact with the insulating layer 134. Next, material of the electrode 136 is reacted with material of the insulating layer 134, causing the insulating layer 134 to be reduced, i.e., to provide oxygen to the formation of a reaction layer 137 of $TiO_x$ or $TaO_x$ (as appropriate) between the insulating layer 134 and the electrode 136. This provides the second embodiment of resistive memory device 138, with the insulating layer 134 and reaction layer 137 between the first and second electrodes 132,136.This reaction causes deeper traps to be formed in the overall reaction layer-insulating layer structure than in the previous embodiment (i.e., greater energy is required to remove an electronic charge carrier from a trap in this embodiment than in the previous embodiment). While in the first embodiment minimal reaction may occur between two materials, this would not have a significant effect on the traps of the device. It is to be understood that the present reaction is intended to alter the traps.

FIG. 16 is a plot of memory device current vs. electrical potential applied across the resistive memory device 138 with a Ti electrode 136. In order to program the memory device 138 (FIGS. 13 and 16), an electrical potential is applied across the memory device 138 from a higher to a lower electrical potential in the direction of from electrode 136 to electrode 132, by applying $V_{pg2}$ (the "program" electrical potential) to the electrode 136. This causes electronic charge carriers in the form of electrons and/or holes to enter the insulating layer 134 and reaction layer 137 and fill traps therein, to provide that the overall memory device 138 is in a conductive, low-resistance (programmed) state (E). The current through the memory device 138 is limited to a relatively low level by application of a relatively low voltage $V_{g2}$ to the gate of the transistor 140. Upon removal of such potential the memory device 138 remains in a conductive or low-resistance state having an on-state resistance indicated at (F), due to the long retention associated with deep trap levels.

In order to erase the memory device 138 (FIGS. 14 and 16), an electrical potential is applied across the memory device 138 from a higher to a lower electrical potential in the direction of from electrode 132 to electrode 136, i.e., the direction opposite to the direction of the programming potential, by applying $V_{er2}$ to the electrode 132 and grounding electrode 136. This causes electronic charge carriers to leave the traps in the insulating layer 134 and in the reaction layer 137 (G), so that the overall memory device 138 is in a high-resistance (erased) state.

The read step is similar to that for the first embodiment.

As will be seen, based on the selection of the electrode material, for example Ni vs. Ti, and/or the reaction process, the devices 38, 138 have significantly different operational characteristics. For example, the programming characteristics are different, i.e., programming voltage $V_{pg1}$ of the first device 38 is lower than the programming voltage $V_{pg2}$ of the second device 138. Furthermore, the erase characteristics are different, i.e., the erase voltage $V_{er2}$ of the second device 138 is lower than the erase voltage $V_{er1}$ of the first device 38. In fact the first device 38 is substantially symmetrical in behavior and can be erased by applying potential in either direction, while the second device 138 is substantially non-symmetrical in behavior and can be most effectively erased by applying potential in a direction opposite the programming potential. The on-state resistance curves B, F of the devices 38, 138 are substantially different. And, because of the deep traps in the second embodiment 138, (programmed) data retention is improved as compared to the first embodiment 38. These different operating characteristics are dependent on selection of material of the electrode (36, 136), and/or the reaction of the material of that electrode with the material of the insulating layer 134.

Various erase mechanisms of the devices of FIGS. 3 and 12 will now be described.

FIG. 17 again illustrates the resistive memory device of FIG. 3. As described above, with the memory device 38 in its programmed, low-resistance state, electronic charge carriers are held in traps in the insulating layer 34. In order to erase the device 38, trapped electronic charge carriers can escape the traps through either a field-assisted process or a thermal detrapping process, or a combination of these processes. That is, the electronic charge carriers must be taken from trap energy levels to a conduction band/valence band energy level by overcoming trap depth (trap depth=|trap energy level−conduction band/valence band energy level|). At room temperature, without electrical potential applied across the device, the trapped electronic charge carriers are quite stably held by the traps, resulting in the memory device 38 remaining in its programmed state.

With a sufficient electrical potential applied across the device 38 in accordance with the above erasing methods, the energy barrier is sufficiently lowered so that the electronic charge carriers are taken from trap energy levels to a Fermi energy level, causing the electronic charge carriers to escape the traps, so that the device 38 is erased. This mechanism may occur independent of increase in temperature of the device.

In a solid material with unfilled deep-level traps, SCLC current is significantly lowered from the trap-free case by a ratio $\theta$, determined by the trap depth ($\Delta E_t$) and density ($N_t$) as θ ∝ exp($\Delta E_t/kT$)/$N_t$, where k is the Boltzmann constant and T is temperature in K. A dramatic current increase (and resistance reduction) occurs when the deep traps are filled at the traps-filled-limit voltage ($V_{TFL}$) that is determined by the unfilled deep trap density. After that the material is switched from a high-resistance state ("OFF") into a low-resistance state ("ON"). Both OFF and ON states are described by SCLC model. Deep traps lower the OFF state current, and the ON state current approaches the trap-free limit conduction as the deep traps get filled. The ON state retention is determined by the "thermal release time" (detrapping through thermal processes) that is exponentially proportional to $\Delta Et$ as $\tau \propto \exp(\Delta E_t/kT)$. Long retention is expected on materials with the appropriate density of deep level traps.

Thermal de-trapping during the erase operation is achieved by Joule heating caused by the high current through the device 38 as described above. Thermal de-trapping may also be achieved through increase in ambient temperature, or by a combination of Joule heating and an increase in ambient temperature.

Figure 17:
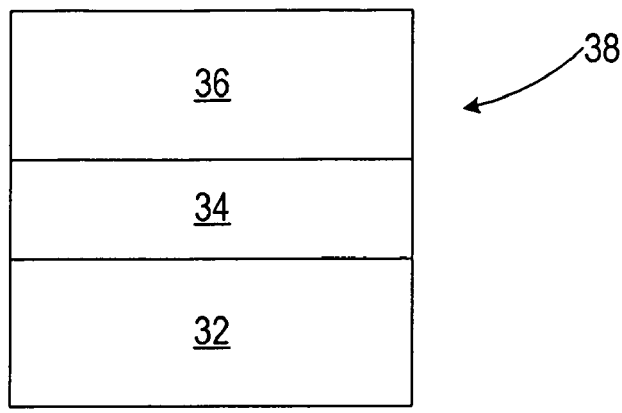
FIGS. 17-21 illustrate approaches in erasing various embodiments of memory device.
Figure 18:
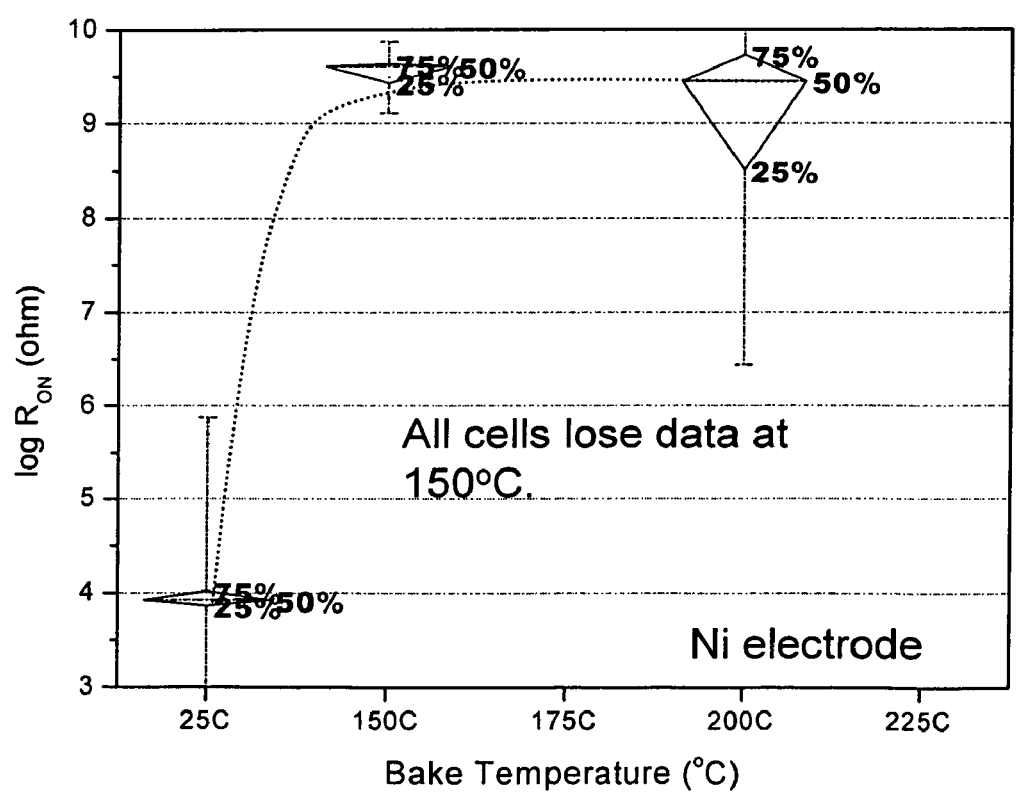

FIG. 18 is a graph illustrating resistance of devices vs. temperature for a number of programmed devices 38 of the type of FIGS. 3 and 17, with Ni electrode 36, illustrating that substantially all of the devices 38 adopt a high resistance (erased) state at 150° C.

Figure 12:
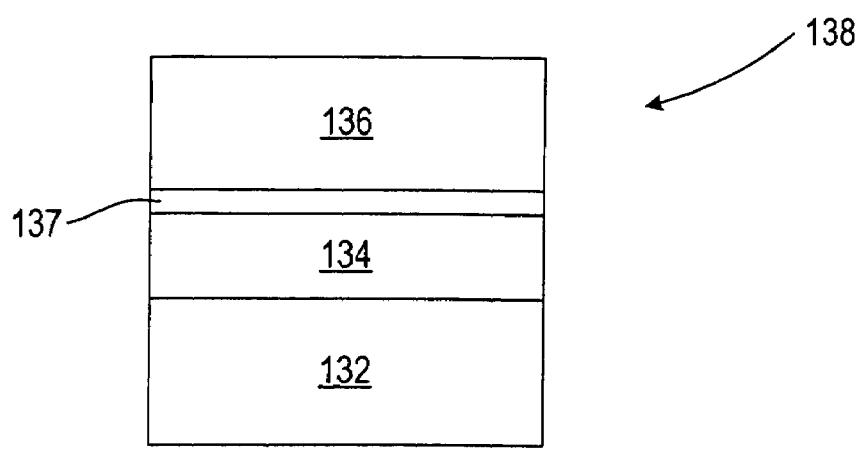

FIG. 19 again illustrates the device 138 of FIG. 12. As described above, with the memory device 138 in its programmed, low-resistance state, electronic charge carriers are held in traps in the insulating layer 134 and reaction layer 137. In order to erase the device 138, the electronic charge carriers must be taken from trap energy levels to a conduction band/valence band energy level by overcoming trap depth (trap depth=|trap energy level–conduction band/valence band energy level|). The trap depth in this case is greater than in the embodiment of FIGS. 3 and 17. At room temperature, without electrical potential applied across the device, the trapped electronic charge carriers are quite stably held by the traps, resulting in the memory device 138 remaining in its programmed state.

With a sufficient electrical potential applied across the device 138 in accordance with the above erasing methods, the energy barrier is sufficiently lowered so that the electronic charge carriers are taken from trap energy levels to a Fermi energy level, causing the electronic charge carriers to escape the traps, so that the device 138 is erased. This mechanism may occur independent of increase in temperature of the device.

Figure 20:
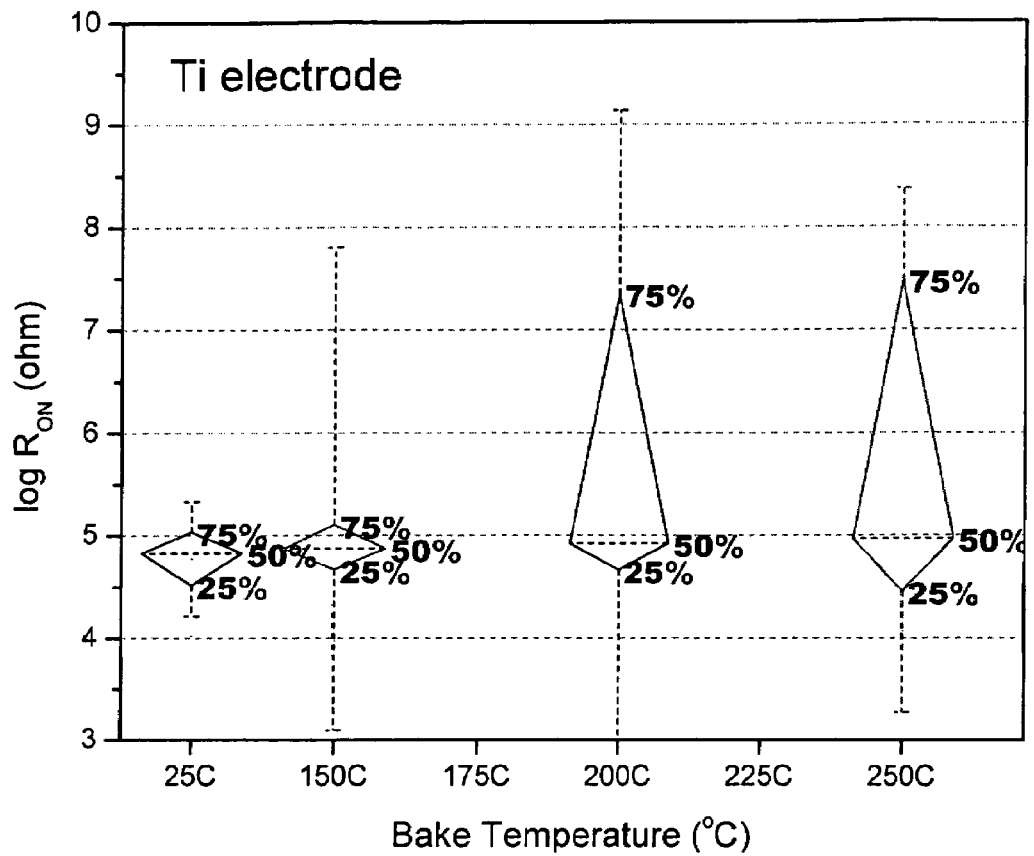
Figure 19:
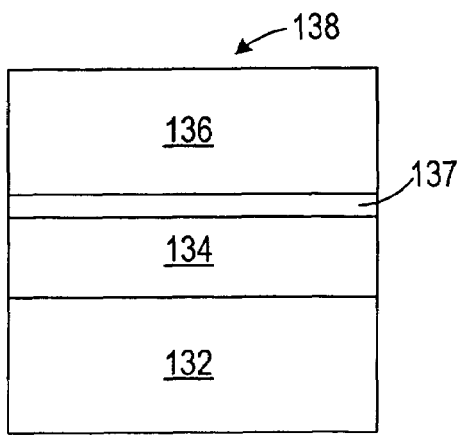

While again sufficiently high temperature through Joule heating and/or increase in ambient temperature (without electrical potential applied to the device 138) will cause the electronic charge carriers to escape the traps, because of the deeper trap energy level, a much higher temperature would be required to erase the programmed device 138 of FIGS. 19 and 12. Indeed, FIG. 20 illustrate that substantially all of a large number of such devices retain their programmed (low resistance) states even at 250° C. Because of this high thermal stability, the erasing process includes application of electrical potential across the device as described above. This is to be compared to the previous embodiment, wherein erasing can be readily achieved through Joule heating and/or increase in ambient temperature.

Thus, the programming thermal stability of the resistive memory device is dependent on the selection of electrode material (36, 136) and/or the reaction of electrode material with material of the insulating layer. As will be seen, the temperature sufficient to erase a programmed resistive memory device is dependent on selection of electrode material and/or the reaction of electrode material with material of the insulating layer.

Figure 21:
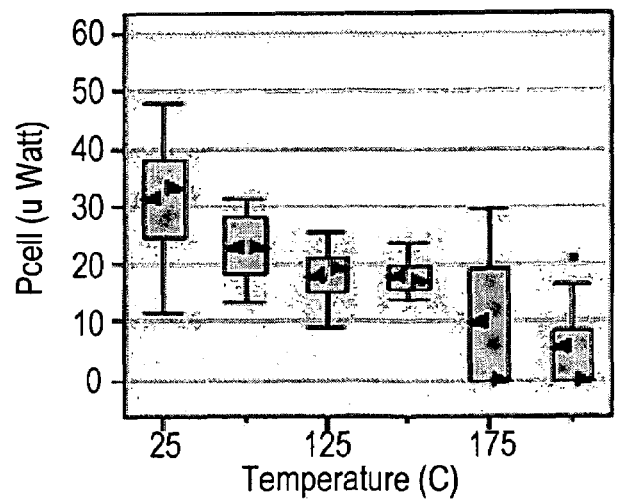

In each approach, both erase approaches (applied electrical potential and increased temperature) may used at the same time. As will be seen from FIG. 21 (for Ni electrode 36), power required to erase programmed devices 38 decreases with increase in device temperature. Arrows pointing to the right indicate median power, while arrows to the left indicate average power. "0" power indicates devices erased by temperature alone.

Figure 22:
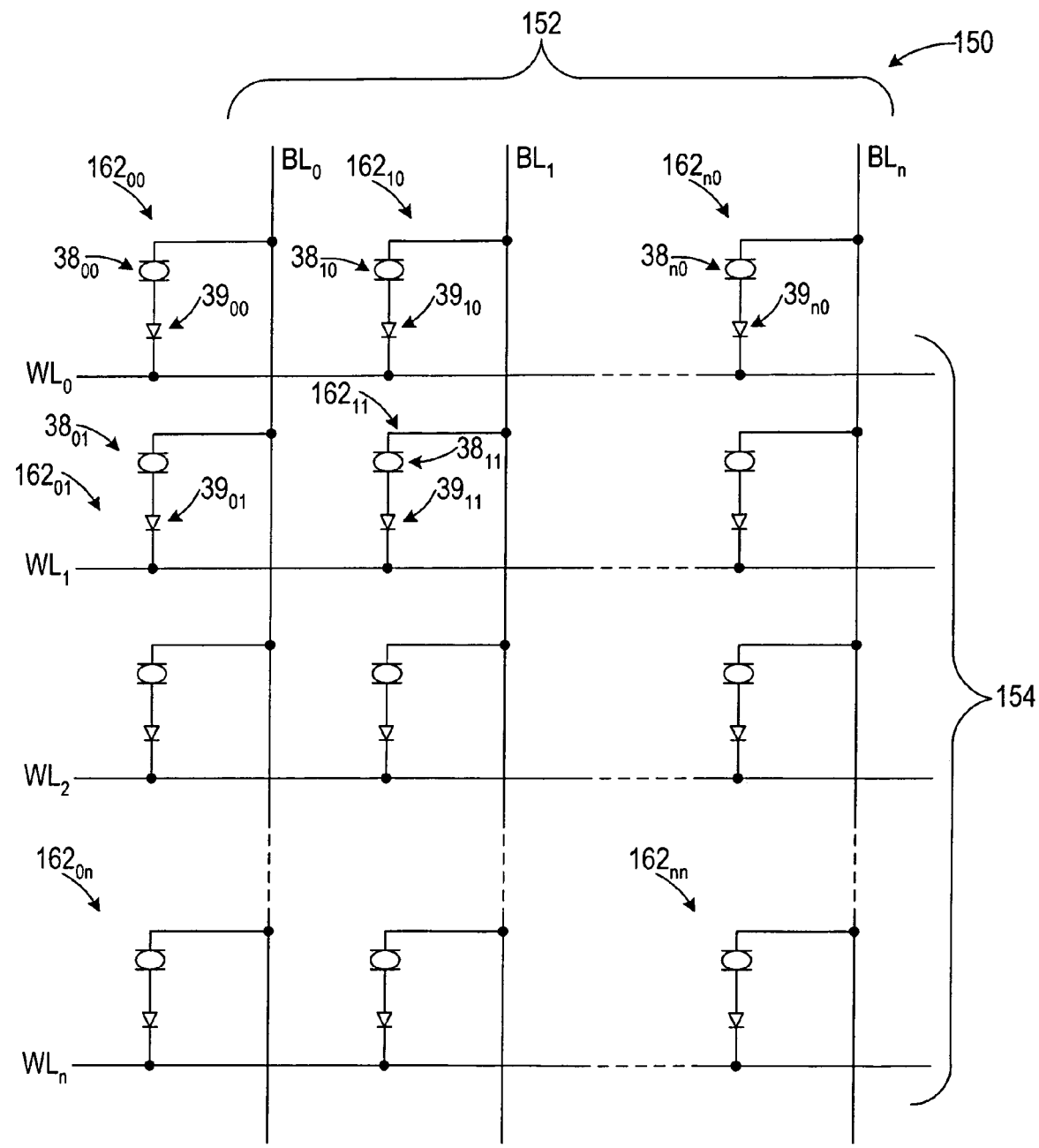
FIGS. 22 and 23 illustrate arrays incorporating resistive memory devices.

FIG. 22 illustrates a high density memory device array 150 which incorporates memory devices 38 as described above and diodes 39. As illustrated in FIG. 22, the memory device array 150 includes a first plurality 152 of parallel conductors (bit lines) $BL_0, BL_1, \ldots BL_n$, and a second plurality 154 of parallel conductors (word lines) $WL_0, WL_1, \ldots WL_n$ overlying and spaced from, orthogonal to, and crossing the first plurality of conductors 152. A plurality of memory devices 38 are included, each in series with a diode 39, to form a memory device-diode structure 162 which connects a bit line with a word line at the intersection thereof, with the diode in a forward direction from the bit line to the word line. Each memory device-diode structure 162 may be manufactured as a stacked structure, so that efficient manufacturing thereof is achieved.

Figure 23:
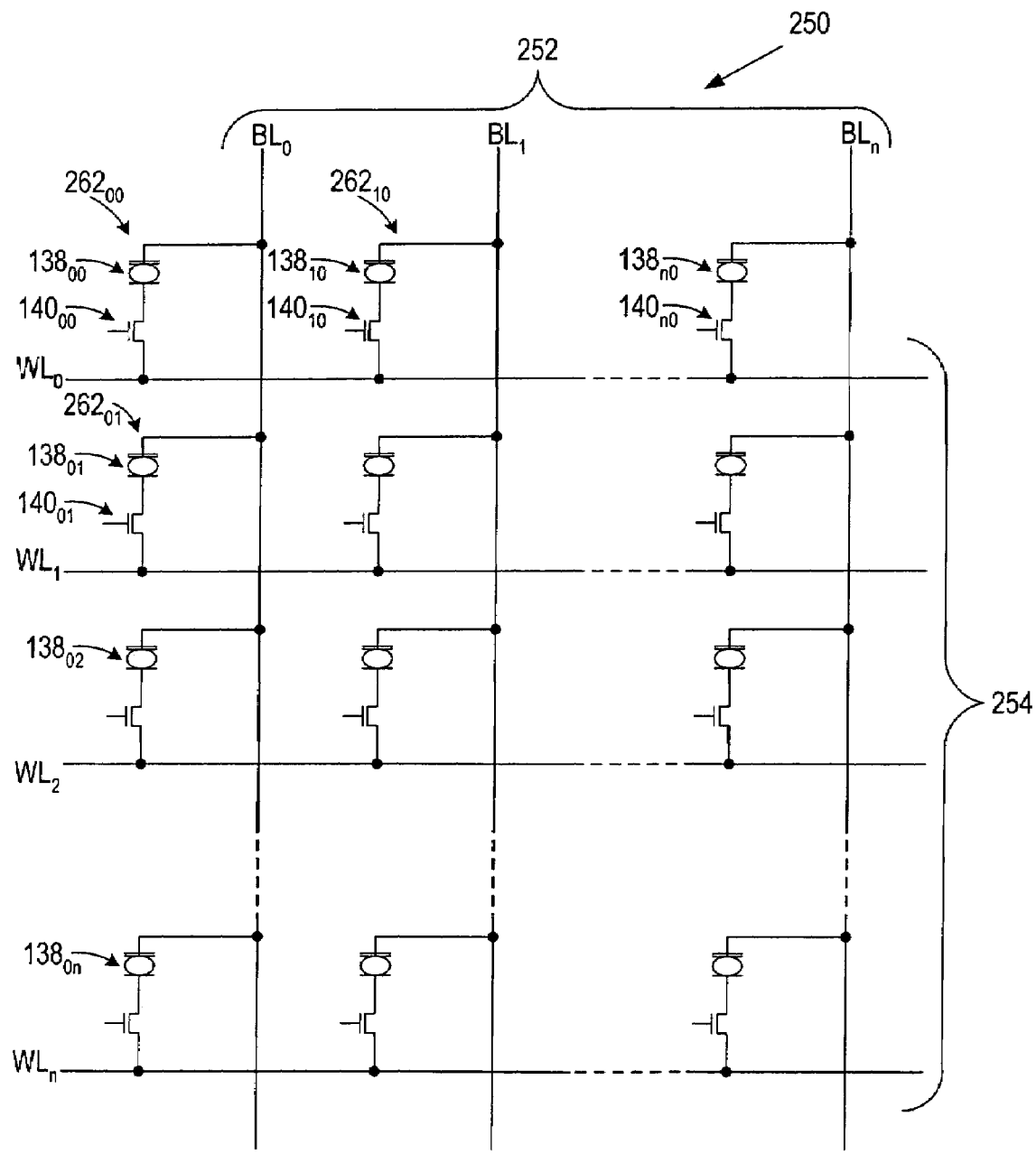

FIG. 23 illustrates a high density memory device array 250 which incorporates memory devices 138 and transistors 140 as described above. As illustrated in FIG. 23, the memory device array 250 includes a first plurality 252 of parallel conductors (bit lines) $BL_0, BL_1, \ldots BL_n$, and a second plurality 254 of parallel conductors (word lines) $WL_0, WL_1, \ldots WL_n$ overlying and spaced from, orthogonal to, and crossing the first plurality of conductors 252. A plurality of memory devices 138 are included, each in series with a transistor 140, to form a memory device-transistor structure 262 which connects a bit line with a word line at the intersection thereof. The transistors 140 act as select devices for the associated memory devices 138. In this embodiment, memory devices 38 may be used in place of memory devices 138.

As will be seen, particular operating characteristics of resistive memory devices may be selected, by selecting electrode material and/or reacting material of an electrode with material of the insulating layer thereof. As examples, the programming, erasing on-state resistance and data retention characteristics can be selected depending on the application.

Figure 24:
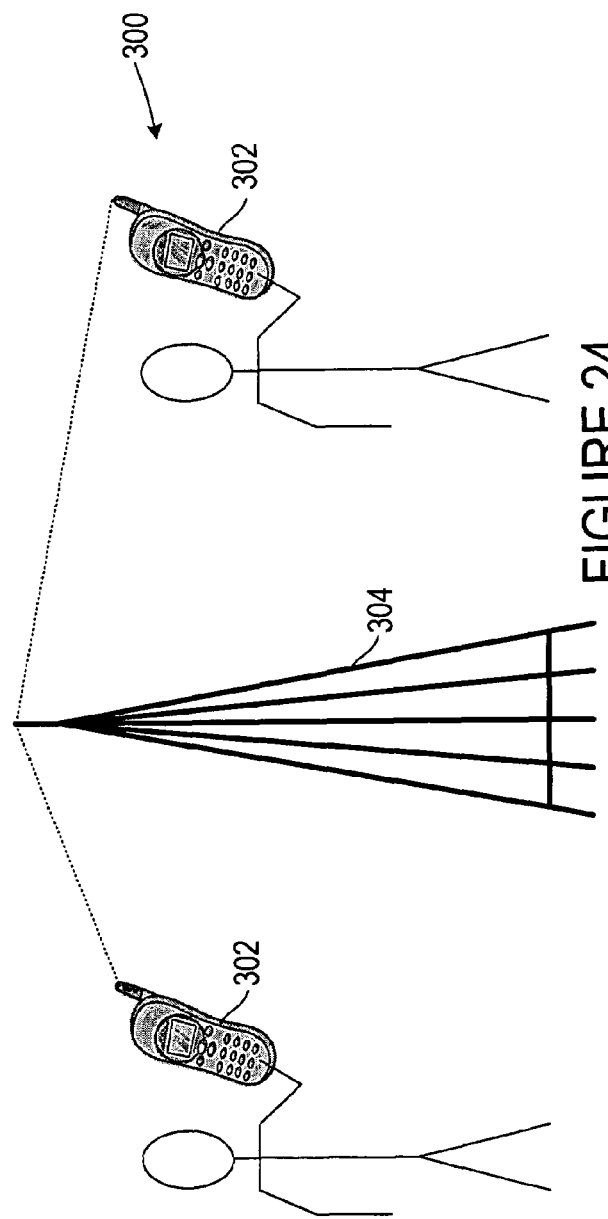
FIGS. 24-26 illustrate systems incorporating the invention.

FIG. 24 illustrates a system 300 utilizing memory devices as described above. As shown therein, the system 300 includes hand-held devices in the form of cell phones 302, which communicate through an intermediate apparatus such as a tower 304 (shown) and/or a satellite. Signals are provided from one cell phone to the other through the tower 304. Such a cell phone 302 with advantage uses memory devices of the type described above for data storage, for example names, telephone number and other data. One skilled in the art will readily understand the advantage of using such memory devices in other hand-held devices which utilize data storage, such as portable media players, personal digital assistants, digital cameras and the like.

Figure 25:
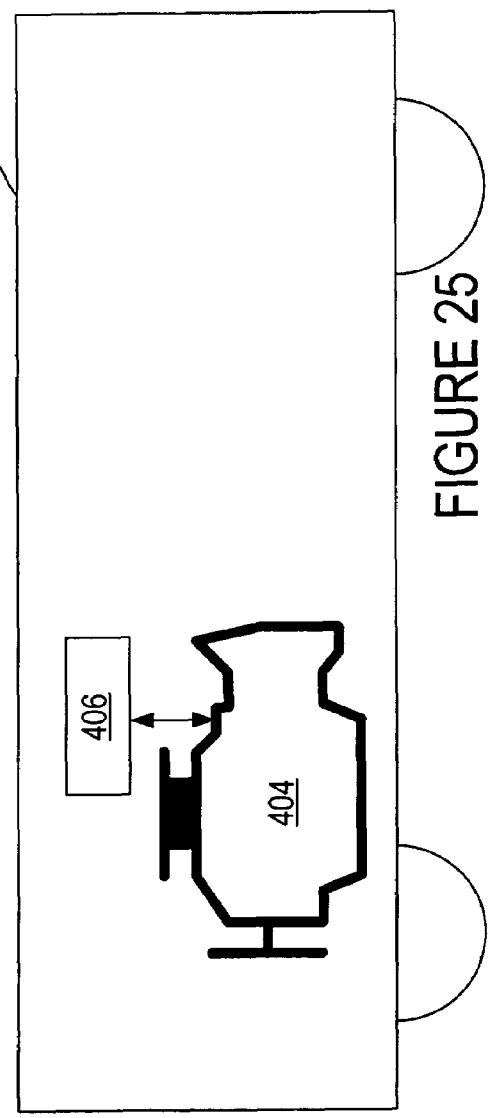

FIG. 25 illustrates another system 400 utilizing memory devices as described above. The system 400 includes a vehicle 402 having an engine 404 controlled by an electronic control unit 406. The electronic control unit 406 with advantage uses memory devices of the type described above for data storage, for example data relating to engine and vehicle operating conditions.

Figure 26:
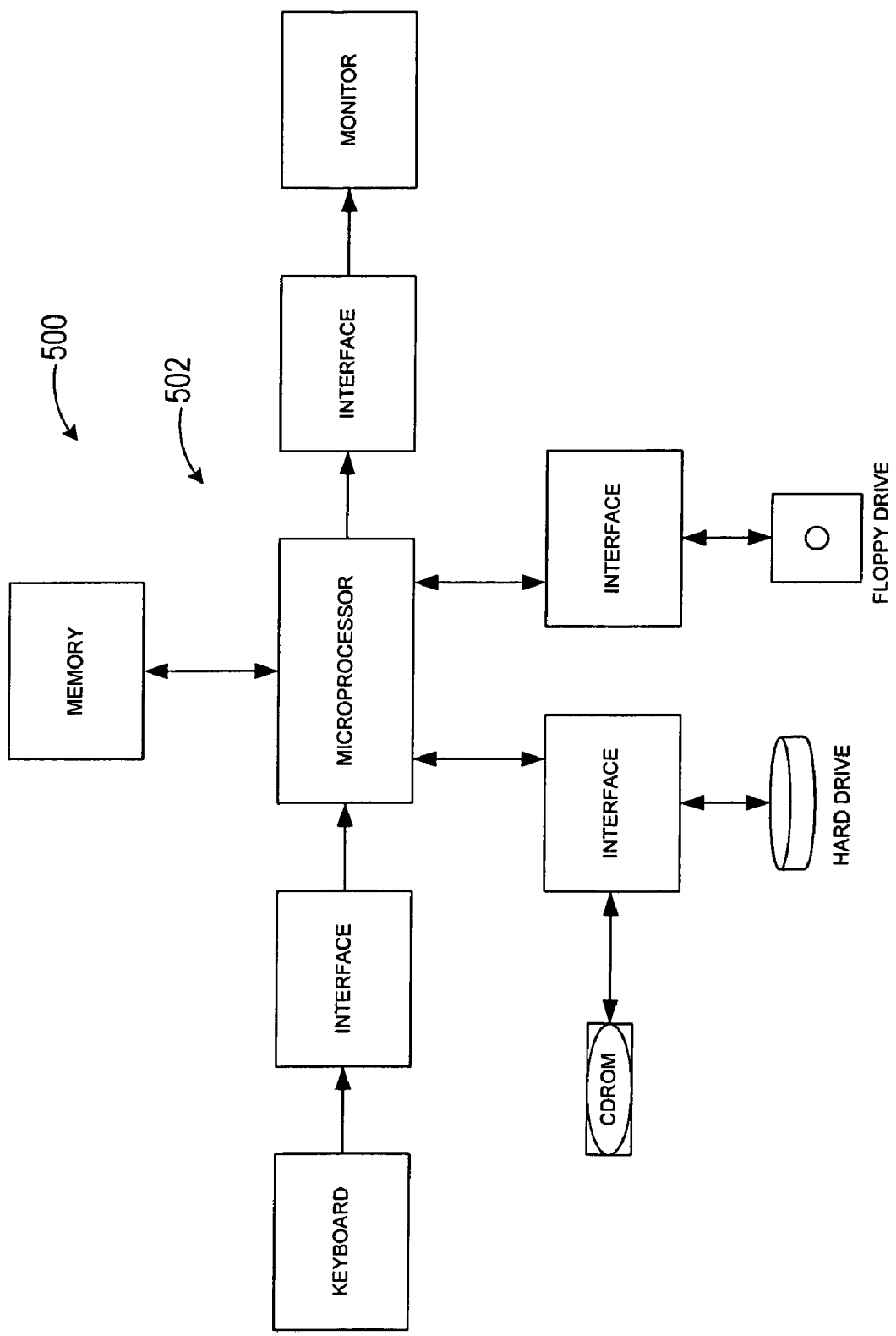

FIG. 26 illustrates yet another system 500 utilizing memory devices as described above. This system 500 is a computer 502 which includes an input in the form of a keyboard, and a microprocessor for receiving signals from the keyboard through an interface. The microprocessor also communicates with a CDROM drive, a hard drive, and a floppy drive through interfaces. Output from the microprocessor is provided to a monitor through an interface. Also connected to and communicating with the microprocessor is memory which may take the form of ROM, RAM, flash and/or other forms of memory. The memory with advantage uses memory devices of the type described above for storage of any data which is of use.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of providing a selected operating characteristic of a resistive memory device, the method comprising selecting material of an electrode of the resistive memory device, wherein the selected characteristic is an on-state resistance characteristic dependent on the selected material of the electrode.

2. A method of providing a selected operating characteristic of a resistive memory device, the method comprising selecting material of an electrode of the resistive memory device, wherein the selected characteristic is a programming characteristic dependent on the selected material of the electrode, wherein the selected characteristic is a programming thermal stability characteristic.

3. A method of providing a selected operating characteristic of a resistive memory device, the method comprising reacting material of an electrode of the resistive memory device with material of an insulating layer of the resistive memory device to form a reaction layer.

4. The method of claim 3 wherein the resistive memory device, prior to said reaction, comprises a first electrode, an insulating layer on and in contact with the first electrode, and a second electrode on and in contact with the insulating layer.

5. The method of claim 3 and further comprising selecting material of an electrode of the resistive memory device, the selected characteristic being dependent on the selected material of the electrode.

6. The method of claim 5 wherein material of the electrode reacting with the material of the insulating layer is the selected material.

7. The method of claim 3 wherein the selected characteristic is an on-state resistance characteristic.

8. The method of claim 3 wherein the selected characteristic is an erase characteristic.

9. The method of claim 3 wherein the selected characteristic is a programming characteristic.

10. The method of claim 3 wherein the selected characteristic is a programming thermal stability characteristic.

11. The method of claim 3 and further comprising said memory device incorporated in a system.

12. The method of claim 11 wherein the system is selected from the group consisting of a hand-held device, a vehicle, and a computer.

13. A resistive memory device comprising:
   a first electrode;
   an insulating layer;
   a reaction layer; and
   a second electrode, the insulating layer and reaction layer being between the first and second electrodes, the reaction layer formed by reaction of the insulating layer and an electrode.

14. The device of claim 13 wherein the reaction layer is an oxide of the material of the reacting electrode.

15. A method of erasing a programmed resistive memory device, comprising:
   providing a temperature of the resistive memory device sufficient to erase the programmed resistive memory device by providing a high resistance erased state of the resistive memory device; and
   selecting material of an electrode of the resistive memory device, the temperature sufficient to erase the resistive memory device being dependent on the selected material of the electrode.

16. The method of claim 15 wherein the step of providing a temperature of the resistive memory device sufficient to erase the programmed resistive memory device comprises Joule heating the device by passage of current through the device.

17. The method of claim 15 and further comprising reacting material of an electrode with material of the insulating layer to form a reaction layer, the temperature sufficient to erase the resistive memory device being dependent on the presence of the reaction of the electrode layer.

18. The method of claim 15 wherein the erasing of the resistive memory device comprises moving electronic charge carriers.

19. The method of claim 18 wherein the electronic charge carriers are moved from traps in the resistive memory device.

20. The method of claim 15 wherein erasing of the programmed resistive memory device further comprises applying an electrical potential across the resistive memory device.

* * * * *